United States Patent [19]

Weiss

[11] Patent Number: 4,694,185
[45] Date of Patent: Sep. 15, 1987

[54] LIGHT SENSING DEVICES WITH LENTICULAR PIXELS

[75] Inventor: Armin K. Weiss, Rochester, N.Y.

[73] Assignee: Eastman Kodak Company, Rochester, N.Y.

[21] Appl. No.: 853,330

[22] Filed: Apr. 18, 1986

[51] Int. Cl.[4] .............................................. H01L 27/14
[52] U.S. Cl. ..................................... 250/578; 357/32; 358/212
[58] Field of Search ........................ 250/578, 201, 204; 358/212, 213; 357/30, 32

[56] References Cited

U.S. PATENT DOCUMENTS 4,362,806 12/1982 Whirmore .
4,410,804 10/1983 Stauffer ............................... 250/578
4,425,501 1/1984 Stauffer ............................... 250/578

FOREIGN PATENT DOCUMENTS 59-147586 8/1984 Japan .
59-148482 8/1984 Japan .

OTHER PUBLICATIONS

Ishihara et al., "A High Photosensitivity IL-CCD Image Sensor with Monolithic Resin Lens Array", IEDM, 19.3, pp. 497–500, (1983).
Saeki et al., "Effect of Microlens Array on MOS Color Imager", IEEE Transactions on Consumer Electronics, vol. CE-31, No. 2, May, 1985.

Primary Examiner—Edward P. Westin
Assistant Examiner—J. L. Ruoff
Attorney, Agent, or Firm—Carl O. Thomas

[57] ABSTRACT

A multipixel light sensing semiconductor device contains in at least one pixel a lens presenting a convex surface and a lens supporting layer for directing light inwardly to a semiconductive light sensor. The lens supporting layer has a thickness exceeding that of the lens, and the lens is laterally confined on the lens supporting layer between at least two opposed pixel edges.

13 Claims, 7 Drawing Figures

FIG. 7 ced regions 104 of

LIGHT SENSING DEVICES WITH LENTICULAR PIXELS

FIELD OF THE INVENTION

The present invention is directed to light sensing semiconductor devices. More particularly, this invention is directed to multipixel light sensing semiconductor devices.

BACKGROUND OF THE INVENTION

Image sensing devices made up of an array of laterally spaced sensors are well known and can take a variety of forms. The array can be viewed as being made up of a number of laterally offset regions, commonly referred to as pixels, each containing a separate sensor. The art has recognized that sensing advantages can be realized by forming a convex lens surface for each pixel, the overall resulting surface being referred to as a lenticular surface. The following teaching is considered to be representative:

R-1 Whitmore U.S. Pat. No. 4,362,806, note particularly FIG. 10, and column 44, lines 41 through 63.

A variety of multipixel semiconductor devices are known. There have been teachings of improving their light sensing properties by forming semicylindrical lenses in a surface resin layer. The semicylindrical lenses are formed by patterning a phenol-novolak system (i.e., a positive-working photoregist) and then heating the resin remaining to a temperature above its glass transition temperature. Individual resin domains flow laterally, causing a convex surface to the be formed. These teachings are illustrated by the following:

R-2 Ishihara et al, "A High Photosensitivity IL-CCD Image Sensor with Monolithic Resin Lens Array", LEDM, 19.3, pp. 497–500 (1983);

R-3 Miyata Japanese Kokai 59-147,586, published Aug. 23, 1984;

R-4 Miyata Japanese Kokai No. 59-148,482, published Aug. 25, 1984;

R-5 Saeki et al, "Effect of Microlens Array on MOS Color Imager", IEEE Transactions on Consumer Electronics, Vol. CE-31, No. 2, May 1985.

In considering the prior state of the art it is, of course, important to differentiate between schematic diagrams of constructions hypothesized and the structures which were actually realized in practice. In the reported devices actually constructed a number of difficulties have been encountered. The lens curvature has been less than that desired, and the optical clarity of the lens forming material has been limited. In fabrication lateral spreading of domains of lens forming material has been observed to occur when the lens forming material of the domains is put in a fluid form as required to achieve the convex lens surface. This has complicated area definition and resulted in rapid loss of surface curvature when material from adjacent domains has come into contact. While low lens curvature can to some extent be compensated by increasing the thickness of the layers separating the lens from the underlying sensing element of the semiconductive substrates, difficulties have been encountered in constructing these separating layers. Although time consuming multiple laydowns of materials forming the separating layers have been practiced, overall layer thicknesses have remained below optimum levels for optical purposes. Finally, the lens shapes attempted have been of less than optimum optical configuration. Thus, while the advantages of lenticular surfaces for multipixel semiconductor sensor arrays have been postulated, their advantages have remained largely unrealized.

SUMMARY OF THE INVENTION

In one aspect, this invention is directed to a light sensing semiconductor device including an array of light sensing pixels comprised of a semiconductive substrate including a light sensing portion spaced laterally inwardly from at least two opposed pixel edges and means for transmitting incident light to said light sensing portion including a lens presenting a convex surface capable of receiving light laterally outwardly of said light sensing portion and directing the light toward said light sensing portion, and a light transmissive portion interposed between the lens and the light sensing portion, characterized in that in at least one of the pixels the light transmissive portion is comprised of a lens supporting layer having a thickness exceeding that of the lens and the lens is laterally confined on the lens supporting layer between at least the two opposed pixel edges.

BRIEF DESCRIPTION OF THE DRAWINGS

The invention can be better appreciated by reference to the following description of preferred embodiments considered in conjunction with the drawings, in which.

DESCRIPTION OF PREFERRED EMBODIMENTS

Figure 1:
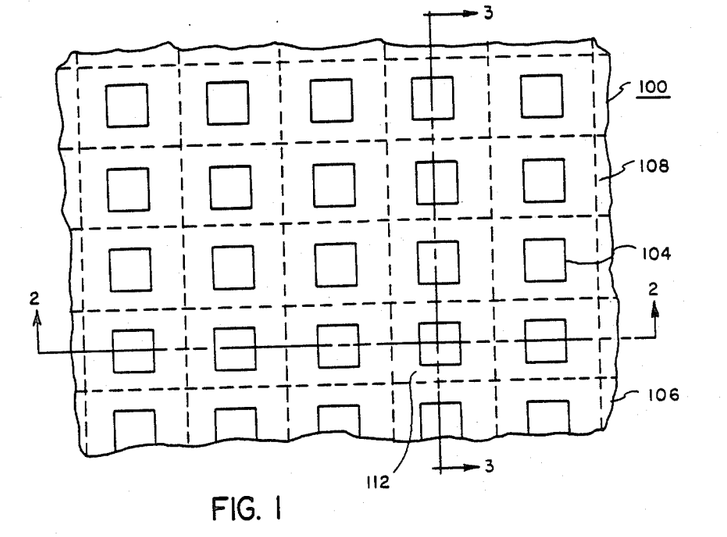
FIG. 1 is a plan view of a multipixel semiconductor array.

In FIG. 1 a mutipixel semiconductor array 100 is shown formed by a semiconductive substrate 102 of a first conductivity type (i.e., N or P conductivity type) containing a plurality of laterally spaced regions 104 of opposite conductivity type (i.e., P or N conductivity type). The two together form a plurality of laterally spaced photodiodes on the substrate capable, with appropriate surface conductors, of forming a useful array of light sensors on the upper surface 106 of the semiconductive substrate. For simplicity, common surface features in addition to the sensors, extraneous to an understanding of the invention, have been omitted from the surface 106.

The semiconductor array can be viewed as being made up of a plurality of pixels, each containing a photodiode sensor centrally positioned adjacent its upper surface and each peripherally defined by linear polygonal boundaries indicated by dashed lines 108.

Figure 2:
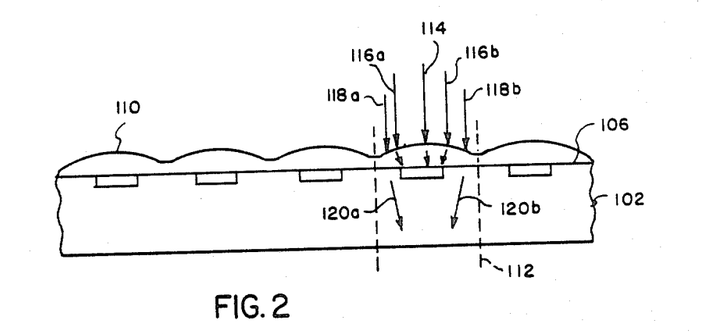
FIGS. 2 and 3 are sectional views taken along section lines 3—3, respectively, in FIG. 1 showing conventional lenticular surface features.
Figure 3:
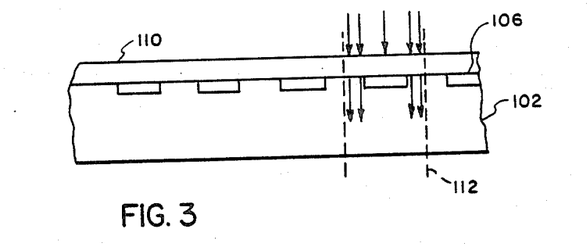

In FIGS. 2 and 3 the multipixel array 100 is shown as it would appear in section with a conventional lenticular surface 110, wherein the individual lenticular each approximate a semicylindrical shape, although exhibiting a much longer radius of curvature than required to achieve this shape. The inefficiency of the lens shape can be seen by noting the arrows representing light striking the pixel 112 lying at the intersection of the section lines 2—2 and 3—3 in FIG. 1. Noting first FIG. 2, as indicated by arrow 114, some of the light strikes the lens surface of the pixel directly above the sensor and is directed to the sensor, as also occurs in the absence of the lens. As indicated by arrows 116a and 116b, some of the light strikes the lens surface laterally outwardly of the sensor and is redirected to the lens. As indicated by arrows 118a and 118b, light striking the pixel nearer its outer edge is not directed inwardly to a sufficient extent to reach the sensor. The light missing the sensor, indicated by arrows 120a and 120b, reflects the inefficiency of the lens. Turning to FIG. 3, it can be seen that the semicylindrical lens shape is ineffective in redirecting light toward the sensor along this axis. The net result is that by using conventional lenticular surface constructions the light received by the sensor is increased to some extent, but the lenticular surface constructions are still highly inefficient as light converging lenses.

Figure 4:
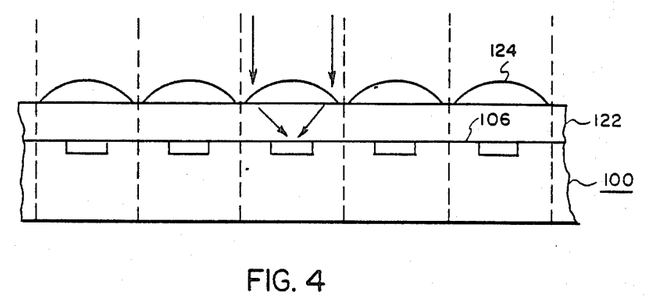
FIGS. 4 and 5 are sectional views taken along section lines 2—2 and 3—3, respectively, in FIG. 1 showing lenticular features satisfying the requirements of this invention.
Figure 5:
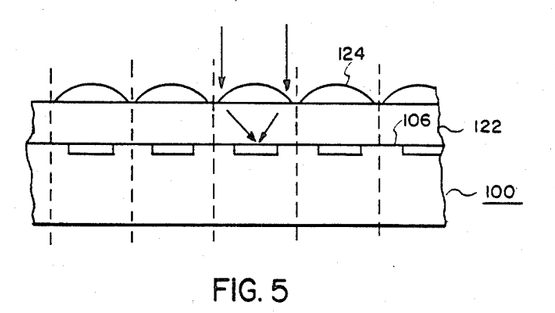

FIGS. 4 and 5 show the semiconductor array 100 viewed along section lines 2—2 and 3—3, respectively but with the conventional lenticular surface providing material of FIGS. 2 and 3 replaced by a construction according to the present invention for more efficiently transmitting incident light to the pixel sensors. A transparent layer 122 on the surface 106 of the semiconductor array 100 acts to support and laterally space individual lenses 124.

Figure 6:
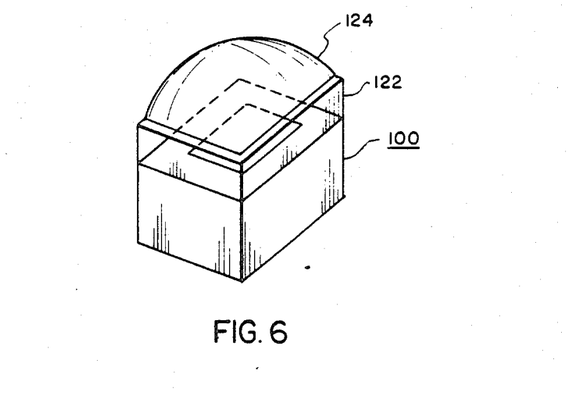
FIG. 6 is an isometric detail of a single pixel satisfying the requirements of the present invention.

Noting particularly FIG. 6, each lens 124 is located on the lens supporting layer 122 just inwardly of the peripheral edges of the pixel. In this way the lens intercepts almost all of the light incident upon the pixel, but still remains confined within the pixel boundaries. As shown by arrows in FIGS. 4 and 5, unlike the conventional lenticular surface 110, the individual lenses can have their foci at or above the sensors of the semiconductive substrate.

As shown, incident light is directed to the center of each sensor by the individual lenses. This is achieved in part by the individual lenses approximating a hemispherical configuration over a major portion of their light intercepting surfaces, as opposed to the much less efficient semicylindrical lens shape. Also important to this result are the lower radii of curvature of the individual lenses and the greater spacing of the light intercepting surfaces of the lenses from the semiconductive surface 106. The latter is made possible by the lens supporting layer exhibiting a greater thickness than the lens itself. The lens supporting layer is, in fact, preferably much thicker than layers such as photoresist layers normally positioned on semiconductive substrates.

In the past lenticular surfaces (but not discrete lenses) have been made using positive working photoresists (e.g., phenol-novolak resins). The photoresists have been imagewise exposed along opposed parallel pixel boundaries and developed to leave unexposed resist domains. Subsequent heating to a temperature above the glass transition temperature of the polymer forming the domains has resulted in slumping of the domains along their edges, leading to a semicylindrical lens shape approximation. Since photoresist layers of more than 3 or 4 μm are difficult to form, even with successive coatings, the lens surface has been spaced from the semiconductive substrate surface by much less than the radius of curvature of the lens. When a supporting layer of the phenol-novolak resin has been formed prior to forming the photoresist domains, the difficulty has been experienced that the photoresist at its glass transition temperature readily wets the underlying layer and spreads laterally. Wetting itself increases the lens radius of curvative. When softened materials from adjacent domains meet on the supporting layer, the lenses exhibit a further marked increase in their radii of curvature—i.e., the desired curved shape tends to be markedly dissipated.

It has been discovered that lenticular surfaces having the highly desirable optical properties of the invention and avoiding disadvantages heretofore encountered as described above can be achieved by employing difering materials for constructing separate, laterally spaced lenses and the lens supporting layer. According to one preferred approach the lens forming material is chosen to exhibit a limited degree of wetting of the lens supporting layer when the polymer of the lens forming domains is heated above its glass transition temperature. If the lens forming polymer is incapable of wetting the underlying supporting layer, it will assume a circular circumference with the lens surface itself approximating a hemispherical boundary, even when the domains initially have linear polygonal edges. In this instance the contact angle (the angle of the lens surface at its intersection with the supporting layer) is quite high, resulting in a short radius of curvature. Individual laterally spaced lenses are formed on the supporting layer, and increased radii of curvature attributable to wetting and merging of adjacent softened polymer domains are entirely avoided.

In the preferred form of the invention there is limited wetting of the supporting layer by the lens forming polymer domains. It is possible to construct the polymer domains so that they are each capable of wetting the portion of the supporting layer with which they are initially placed in contact, but incapable of further wetting the surrounding surface of the supporting layer when heated to their glass transition temperature. Since the lens forming polymer when softened will tend to spread over the entire area it is capable of wetting, but is repelled from surrounding areas which it is incapable of wetting, the result is to pin or anchor the base of the resulting lens in the configuration of the area of contract between the polymer domain and the supporting layer. No perceptible lateral spreading of the lens forming polymer on the supporting layer occurs. Nor does any perceptible pull back from the supporting layer surface occur, as occurs to a limited extent when the lens polymer fails to wet the supporting layer. Within the area of wetting the polymer during softening reshapes itself to minimize surface area, which is the known surface tension response of a liquid, but the peripheral definition of the lens is unaltered.

One approach to achieving selective wetting of the supporting layer by the polymer domains without wetting of surrounding areas is to incorporate a vaporizable wetting agent in the photoresist from which the polymer domains are formed. Following exposure and development of the photoresist layer to leave the polymer domains, uniform heating evaporates the wetting agent from the surface of the supporting layer surrounding the polymer domains. Evaporation of the wetting agent is retarded in areas corresponding to the polymer domains, since the polymer acts as a diffusion barrier. The result is that heating can be employed to selectively remove the wetting agent in areas surrounding the polymer domains while leaving the wetting agent in contact with the supporting layer beneath the polymer domains. While heating to promote selective evaporation is specifically contemplated, excessive heating, such as extended baking, removes wetting agent also from polymer domains and can result in some shrinkage of the area of contact between the lens forming material and the supporting layer as occurs when a move is employed. hydrophobic supporting layer is employed.

A discrete lens presenting a convex surface can be formed which preferably has a polygonal base and which otherwise approximates a hemispherical boundary. Such polygonal base lens configurations are referred to as pillow lenses. The pillow lens configuration more fully occupies polygonal pixel areas than circular base lenses having similar minimum lateral spacings.

By forming separate, laterally spaced lens elements and controlling their wetting of the supporting layer, the radius of curvature of the lens elements can be shortened as compared to the lenticular surface constructions of the prior art. It is further appreciated that by controlling the thickness of the supporting layer the foci of the lenses can be optimally located in relation to the sensors. In theory the sensor can be located so that all of the incident light gathered by the lens is directed to a focal point at the center of the sensor. In practice, proper relative positioning of the sensors and lenses can allow most light to be directed to limited central areas of the sensors. Since only these central light receiving areas of the sensors are required, the area of each individual sensor can be reduced, leaving additional area available on the semiconductive substrate for performing other useful functions. Alternatively, by reducing the sensor area required through the use of a more efficient light gathering arrangement, the area savings can be used to reduce the size of individual pixels. This can allow the number of pixels per unit area (i.e., the packing density of the pixels) to be increased. Increased packing density for a given substrate area can be translated into an overall increase in the numbers of pixels which can be fabricated in a single semiconductor device. Thus, the present invention is compatible with megapixel semiconductor device arrays.

For optimum concentration of incoming light at the individual sensors the lens supporting layer is preferably formed of substantially greater thicknesses than easily fabricated with ordinary photoresist materials. Photoresists used for pattern definition in semiconductor manufacture are formulated for achieving precise edge definitions and are seldom more than 3 or 4 $\mu m$ in thickness. At the same time such photoresists exhibit optical densities well above those desired for lens constructions. While the polymers forming the photoresists themselves often are substantially transparent, activators and other performance modifying addenda elevate photoresist layer densities.

The supporting layers employed in the practice of the present invention preferably transmit at least 95 percent and optimally transmit more than 99 percent of the light they receive. The minimum thickness of the supporting layer for optimum performance increases as the size of the pixel increases. For relatively small pixels of approximately 6 $\mu m$ in mean width and sensor widths of 3 $\mu m$ supporting layer thicknesses are preferably at least about 6 $\mu m$. For more commonly encountered pixel sizes of greater than 10 $\mu m$ in mean width and sensor widths of 6 $\mu m$. For more commonly encountered pixel sizes of greater than 10 $\mu m$ in mean width and sensor widths of 6 $\mu m$ or more the supporting layer thickness is preferably greater than 10 $\mu m$. It is not possible to achieve either the preferred supporting layer optical transparency or thickness with photoresists normally used for achieving pattern definitions in semiconductor device manufacture.

The lens elements, however, normally exhibiting substantially lower thicknesses than the supporting layers, can be and preferably are formed of conventional positive working photoresist materials, such as phenolnovolak resins. Because of the relatively limited thickness of the lens elements, organic light absorbing components can be decolorized after development to form polymer domains by photobleaching. Exemplary of known positive working photoresists useful in forming individual lens elements are those disclosed in U.K. Pat. No. 1,546,633 and U.S. Pat. No. 4,365,019, the teachings of which are here incorporated by reference.

Other lens element material choices are, of course, possible, provided certain general capabilities are maintained. The lens element material must be chosen to permit domains of controlled area to be positioned on the supporting layer, and the lens element material must be capable of being softened in position so that it can assume the desired convex surface configuration without laterally spreading on the supporting layer.

When the lens forming material is developable in an aqueous developer, as is typical of positive working photoresists, it is preferred that the substrate layer be formed of a relatively more hydrophobic polymer to prevent lateral spreading of the lens elements and to resist developer penetration. This can be quantitatively expressed in terms of the following test: When a drop of an aqueous 1.5 weight percent solution of tetramethylammonium hydroxide is placed on a horizontal planar surface of light exposed lens forming material, it should exhibit a contact angle at least 5 degrees lower than the contact angle exhibited when the same solution is placed on the support layer. The contact angle is measured about 2 minutes after contact.

Since many organic polymers are hydrophobic in nature, it is apparent that a wide variety of relatively hydrophobic supporting layers are possible. Supporting layers can be chosen from a variety of known organic polymers, such as vinyl polymers, polyesters, polyamides, polyimides, and the like. Where limited wetting of the supporting layer is not required, highly hydrophobic polymers such as fluoropolymers—e.g., poly(tetrafluoroethylene) and poly(vinylidene fluoride)—can be employed. The use of still other polymers which are hydrophobic to a lesser degree, such as polyalkylanes—e.g., poly(ethylene) and poly(propylene)—and poly(styrene), are contemplated.

To modulate hydrophobicity so that controlled wetting of the supporting layer by the lens material is achieved it is preferred to employ as the supporting layer polymers which have one or more pendant polar groups, such as acid, ester, amide, or other common polar groups. Acrylic and methacrylic acid, ester, and amide polymers and copolymers satisfying the above indicated contact angle relationships are particularly preferred for forming the supporting layers.

Since the semiconductive substrate in most instances presents areas in addition to the pixel areas, such as areas for external lead attachments, it is generally preferred to employ a supporting layer material which can be areally patterned. The preferred supporting layer materials are those capable of being selectively positioned overlying pixel areas on the semiconductive substrate by imagewise exposure followed by development to remove unexposed materials. Incorporation of conventional photoactivators to initiate polymerization in monomeric coatings or crosslinking in linear polymeric coatings or crosslinking in linear polymeric coatings can be relied upon to achieve the desired photo definition of the supporting layer.

When the preferred supporting layer thicknesses and optical transparencies discussed above are to be achieved, many otherwise useful materials are unsuitable, either because they exhibit excessive light absorption or because they generate excessive internal stress. Otherwise useful polymeric substrate materials when coated at thickness of greater than about 6 μm have been observed to respond to photo insolubilization by producing cracks, fissures, buckling, and other mechanical imperfections limiting their optical utility. These mechanical imperfections are attributed to excessive internal stresses that cannot be adequately dissipated in relatively thick unitary coatings.

Supporting layer thickness in excess of 10 μm and up about 30 μm in thickness of the preferred high levels of transparency and few, if any, observable mechanical defects have been produced using a blend of an acrylic or methacrylic monomer and a linear acrylic or methacrylic polymer in a weight ratio of about 5:1 to 1:3. Specific preferred formulations are provided in the examples.

Figure 7:
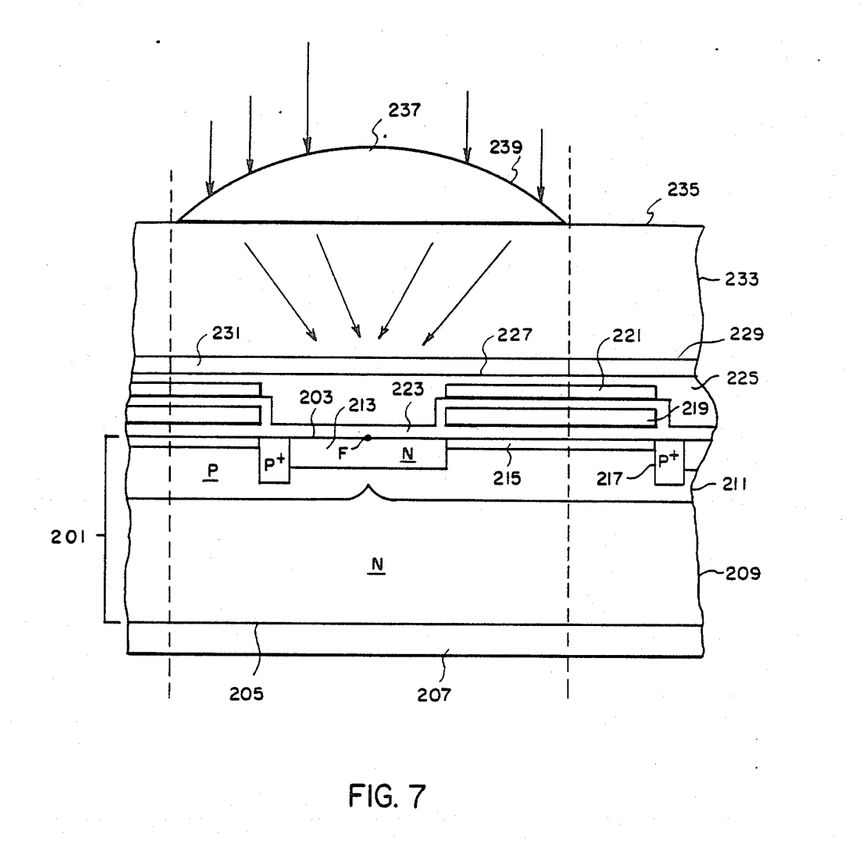
FIG. 7 is a sectional view of a single pixel of an interline charge coupled device employing a photodiode pixel sensor.

To illustrate the application of the invention to a preferred multipixel semiconductor device, a pixel, defined by parallel vertical dashed lines, of an interline charge coupled device (CCD) provided with a light gathering construction according to this invention is shown in FIG. 7. A semiconductive substrate 201, typically a monocrystalline silicon substrate, is shown having an upper major surface 203 and a lower major surface 205. A conductive layer 207 covers the lower major surface. The semiconductive substrate has an N conductivity type region 209 and a P conductivity type well 211 formed by diffusion from the upper major surface 203. A photodiode is formed centrally in the pixel by an N diffusion 213 from the upper major surface. The function of the photodiode is to supply electrons to the P well in proportion to the amount of light received on exposure.

The electrons are supplied to an adjacent charge coupled device. To create a buried channel for electron transfer a shallow N conductivity type region 215 is located adjacent the upper major surface. The buried channel thus formed extends from the photodiode to an adjacent CCD. To prevent unwanted lateral charge conduction, P+ conductivity type zones 217, referred to as channel stops, isolate the photodiode and the adjacent CCD from other adjacent surface structures.

A gate electrode 219, typically formed of polycrystalline silicon, is shown overlying the upper surface of the semiconductive substrate. Since polycrystalline silicon is transparent, a light shield 221, typically formed of aluminum, overlies the gate electrode. A transparent insulator 223 is shown overlying the entire upper major surface of the semiconductive substrate and also separating the gate electrodes from the light shields. Typically the insulator is silicon dioxide, with a surface laydown of passivant, such as borosilicate glass, being common. Although shown as unit, the insulator is typically formed in several successive fabrication steps. A transparent insulative material 225, commonly referred to as a planarizing material, is positioned to provide a smooth surface 227. On this surface is positioned a filter 229 having an element 231, such as an additive primary filter element, coextensive with the pixel boundaries.

A relatively thick lens supporting layer 233 overlies the filter and presents an upper surface 235. A pixel lens element 237 is positioned on the upper surface of the support layer. The lens element is spaced inwardly from the boundaries of the pixel and hence is laterally spaced from lens elements of all adjacent pixels. The lens surface 239 can be semicylindrical, if desired, but is preferably hemispherical. In the optimum form of the invention the supporting layer surface 235 within the pixel boundaries is polygonal, and the lens edges are parallel to and spaced just inwardly of the pixel boundaries. This results in a pillow shaped lens.

Light striking the lens surface 239, indicated by vertical arrows, is bent inwardly, as indicated by the converging arrows in supporting layer 233. The light is shown directed to the focal spot F on the surface of the photodiode.

It should be noted that the inward directing of light from the lenses to the photodiode causes light to be received by only the central portion of the filter. Thus, the lens constructions allows edge alignments of the pixel boundaries and the filter elements to be relaxed without incurring an optical penalty.

While only one pixel of the exemplary semiconductor device is shown in FIG. 7, it is appreciated that actual devices typically contain very large numbers of essentially similar pixels, actual numbers ranging in the $10^3$ to $10^6$ orders of magnitude, depending on the application being served. While the invention has been described in terms of directing light to a photodiode, it is appreciated that many CCD's are constructed for directly sensing light and that for such applications each CCD sensor occupies a central pixel location. The application of the invention to still other light sensing multipixel semiconductor arrays will be readily appreciated.

EXAMPLES

The invention can be better appreciated by reference to the following specific examples:

EXAMPLE 1

A monocrystalline silicon wafer 100 mm in diameter containing 68 multipixel semiconductor arrays each containing several thousand pixels similar to that shown in FIG. 7, but lacking the supporting layer 233 and lens elements, was employed as a starting element.

To condition the wafer for coating it was baked for 6 minutes at 200° C. in a nitrogen atmosphere and cooled to ambient. Two ml of a 50 percent by weight solution of hexamethyldisilazane in ethylene glycol monoethyl ether acetate was dispersed onto the wafer surface, and the wafer was spun for 15 seconds at 3 Krpm (3,000 revolutions per minute).

A coating solution was prepared by combining 80.0 grams of chlorobenzene solvent, 2.0 grams of a ketocoumarin sensitizer, 2.0 grams of ethyl p-dimethylaminobenzoate polymerization activator, 25.0 grams of the acrylic monomer dipentaerythritol monohydroxypentaacrylate (commercially available under the trademark SR-399 from Sartomer Company. West Chester, Pa.) and 25.0 grams of a soluble methyl methacrylate polymer having an inherent viscosity of 0.5 and a molecular weight of approximately 150,000 (commercially available under the trademark Elvacite 2021 from Du Pont). Five ml of the coating solution was applied to the wafer, and the wafer was spun at 1.5 Krpm for 2 minutes. The wafer was then baked at 130° C. for 8 minutes in ambient air.

Using a photolithographic mask the wafer was selectively exposed to actinic radiation in areas of the wafer overlying the pixels requiring lenses. Ultraviolet actinic radiation was supplied using a Parallel Light Aligner, Model PLA-501FA, available from Canon, Inc., Optical Products Division. The unexposed areas of the imagewise exposed coating were removed by spinning the wafer at 0.2 Krpm for 30 seconds while continuously applying 4-methyl 2-pentanone as a developer to the surface of the coating. The wafer was then baked at 195° C. for 10 minutes in a nitrogen atmosphere and cooled to ambient temperature.

To form the lenses, 3 ml of a positive working photoresist composition of the type described in U.S. Pat. No. 4,365,019 having a viscosity of 100 centistokes was applied to the wafer. To distribute the lens forming material uniformly, the wafer was spun at 1.1 Krpm for 4 minutes. The wafer was then baked at 95° C. for 8 minutes in a nitrogen environment.

Using an aligned photolithographic mask the wafer coating was selectively exposed to actinic radiation from the light source identified above in areas along pixel boundaries. Exposed portions of the coating were removed by immersion for 90 seconds in a 1.5 weight percent solution of tetramethylammonium hydroxide in deionized water also containing a surfactant. The wafer was rinsed by spinning at 0.2 Krpm for 30 seconds while continuously applying deionized water. Finally, the wafer was spin dried at 3 Krpm for 60 seconds.

The remaining positive photoresist domains were now exposed uniformly for 48 seconds again using the light source identified above. The prolonged exposure photobleached the domains, reducing their optical density. Following dark storage for 90 minutes under ambient conditions the photoresist domains were transformed into pillow shaped lenses by baking the wafer at 160° C. for 36 minutes in a nitrogen atmosphere.

Microscopically examined pixels, including sectioned pixels, showed pillow shaped lenses lying within and paralleling the boundaries of rectangular pixels having a longer edge of 18 μm and a shorter edge of 10 μm. The supporting layer thickness was in this instance 11.5 μm. There was no evidence of lateral spreading by the lens forming material, and none of the lenses microscopically examined extended beyond a pixel boundary. The lenses exhibited a relatively short radius of curvature, with the foci of the lens appearing to lie within the supporting layer.

EXAMPLE 2

The relative hydrophobicities of the supporting layer and the lens forming material of Example 1 were compared using planar layers of each material in the following manner:

A planar lens supporting layer was formed on a glass substrate employing the steps described in Example 1, but stopping short of overcoating this layer. A planar coating of lens forming material was similarly coated on a glass substrate employing the steps described in Example 1, except that the layer was uniformly light exposed, but not developed.

Onto to each coating was then placed a droplet of deionized water containing 1.5 weight percent tetramethylammonium hydroxide to provide the alkalinity equivalent of a commercial positive photoresist developer. The contact angle between the droplet and the supporting layer surface was measured using a goniometer.

The supporting layer contact angle was initially 55°, but declined to 52° after 90 seconds and remained at 52° 120 seconds after initial contact.

The lens forming material planar layer contact was initially 53°, but declined to 43° after 90 seconds and was 42° 120 seconds after initial contact. Thus, after 120 seconds the lens forming material has a 10° lower final contact angle with the droplet than the supporting layer. This demonstrated the supporting layer to be substantially more hydrophobic.

EXAMPLE 3

A monocrystalline silicon wafer 100 mm in diameter containing 68 multipixel semiconductor arrays each containing several thousand pixels similar to that shown in FIG. 7, but lacking the supporting layer 233 and lens elements, was employed as a starting element.

To condition the water for coating it was baked for 6 minutes at 200° C. in a nitrogen atomosphere and cooled to ambient. Two ml of a 50 percent by weight solution of hexamethyldisilazane in ethylene glycol monoethyl ether acetate was dispersed onto the water surface, and the water was spun for 15 seconds at 3 Krpm (3,000 revolutions per minute).

A coating solution was prepared by combining 111 grams of a 9 percent by weight solution in chlorobenzene solvent of poly(methyl methacrylate) (commercially available as KTI-950K PMMA from KTI Chemicals, Inc. of Wallingford, Conn.); 20 grams of dipentaerythritol monohydroxyphentaacrylate (commercially available under the trademark SR-399 from Sartomer Company, West Chester, Pa.); 1.0 gram of a ketocoumarin sensitizer, 2.0 grams of ethyl p-dimethylaminobenzoate polymerization activator; and 10.0 grams of a soluble methyl methacrylate polymer having an inherent viscosity of 0.19 and a molecular weight of approximately 35,000 (commercially available under the trademark Elvacite 2008 from Du Pont). Five ml of the coating solution was applied to the water, and the water was spun at 1.5 krpm for 2 minutes. The water was then baked at 130° C. for 5 minutes in ambient air.

Using a photolithographic mask the water was selectively exposed to actinic radiation in areas of the wafer overlying the pixels requiring lenses. Ultraviolet actinic radiation was supplied using a Parallel Light Aligner, Model PLA-501FA, available from Canon, Inc., Optical Products Division. The unexposed areas of the imagewise exposed coating were removed by spraying the wafer for 60 seconds with 4-methyl-2-pentanone developer followed by spraying for 30 seeonds with isopropyl alcohol and spin drying at 3 Krpm for 60 seconds. The wafer was then baked at 195° C. for 10 minutes in a nitrogen atmosphere and cooled to ambient temperature. The supporting layer thickness was 11.0 μm.

EXAMPLE 4

Example 3 was repeated, but with development being achieved by spraying with 2-butanone for 15 seconds. The same supporting layer thickness was obtained.

EXAMPLE 5

Example 3 was repeated, but with the substitution of a coating solution prepared by combining the following ingredients: 35 grams of 1,2-dichloroethane; 35 grams chlorobenzene; 2.0 grams of keto-coumarin sensitizer; 35 grams of dipentaerythritol monohydroxyphentaacrylate (commercially available under the trademark SR-399 from Sartomer Company, West Chester, Pa.); and 25 grams of a soluble methyl methacrylate polymer having an inherent viscosity of 0.19 and a molecular weight of approximately 35,000 (commercially available under the trademark Elvacite 2008 from Du Pont). Development was varied by spraying the imagewise exposed supporting layer for 10 seconds with 2-butanone followed by spraying for 30 seconds with isorpropyl alcohol and spin drying at 3 Krpm for 60 seconds. The supporting layer thickness was 13.3 $\mu$m.

EXAMPLE 6

Example 5 was repeated, but with development being achieved by spraying with 4-methyl-2-pentanone for 15 seconds. The supporting layer thickness was 12.6 $\mu$m.

EXAMPLE 7

Example 3 was repeated, but with the substitution of a coating solution prepared by combining the following ingredients: 85 grams of chlorobenzene; 2.0 grams of keto-coumarin sensitizer; 3.0 grams of ethyl p-dimethylaminobenzoate activator; 20.0 grams of dipentaerythritol monohydroxyphenta-acrylate (commercially available under the trademark SR-399 from Sartomer Company, West Chester, Pa.); and 25 grams of a soluble methyl methacrylate polymer having an inherent viscosity of 0.19 and a molecular weight of approximately 35,000 (commercially available under the trademark Elvacite 2008 from Du Pont). Development was varied by spraying the imagewise exposed supporting layer for 10 seconds with 2-butanone followed by spraying for 30 seconds with isopropyl alcohol and spin drying at 3 Krpm for 60 seconds. The supporting layer thickness was 6.2 $\mu$m.

EXAMPLE 8

Example 7 was repeated, but with development being achieved by spraying with 4-methyl-2-pentanone for 15 seconds. The supporting layer thickness was 6.6 $\mu$m.

EXAMPLE 9

Example 3 was repeated, but with the substitution of a coating solution prepared by combining the following ingredients: 80 grams of chlorobenzene; 2.0 grams of keto-coumarin sensitizer; 2.0 grams of ethyl p-dimethylaminobenzoate activator; 23.0 grams of dipentaerythritol monohydroxyphentaacrylate (commercially available under the trademark SR-399 from Sartomer Company, West Chester, Pa.); and 25 grams of a soluble methyl methacrylate polymer having an inherent viscosity of 0.19 and a molecular weight of approximately 35,000 (commercially available under the trademark Elvacite 2008 from Du Pont). Development was varied by spraying the imagewise exposed supporting layer for 45 seconds with chlorobenzene followed by spraying for 30 seconds with isopropyl alcohol and spin drying at 3 Krpm for 60 seconds. The supporting layer thickness was 7.9 $\mu$m.

EXAMPLE 10

Example 9 was repeated, but with development being achieved by spraying with 4-methyl-2-pentanone for 15 seconds. The supporting layer thickness was 8.2 $\mu$m.

EXAMPLE 11

Example 9 was repeated, but with the rate of spinning of the supporting layer composition reduced to 1.0 Krpm from 1.5 Krpm. Development was undertaken by spraying for 30 seconds with chlorobenzene followed by spraying for 30 seconds with isopropyl alcohol. The wafer was then spun at 3 Krpm for 45 seconds prior to baking. The supporting layer thickness was 12 $\mu$m.

To form the lenses, 3 ml of a positive working photoresist composition of the type described in U.S. Pat. No. 4,365,019 having a viscosity of 100 centistokes was applied to the wafer. To distribute the lens forming material uniformly, the wafer was spun at 1.1 Krpm for 4 minutes. The wafer was then baked at 95° C. for 8 minutes in a nitrogen environment.

Using an aligned photolithographic mask the wafer coating was selectively exposed to actinic radiation from the light source identified above in areas along pixel boundaries. Exposed portions of the coating were removed by immersion for 90 seconds in a 1.5 weight percent solution of tetramethylammonium hydroxide in deionized water also containing a surfactant. The wafer was rinsed by spinning at 0.2 Krpm for 30 seconds while continuously applying deionized water. Finally, the wafer was spin dried at 3 Krpm for 60 seconds.

The remaining positive photoresist domains were now exposed uniformly for 48 seconds again using the light source identified above. The prolonged exposure photobleached the domains, reducing their optical density. Following dark storage for 90 minutes under ambient conditions the photoresist domains were transformed into pillow shaped lenses by baking the wafer at 160° C. for 36 minutes in a nitrogen atmosphere.

Microscopically examined pixels, including sectioned pixels, showed pillow shaped lenses lying within and paralleling the boundaries of rectangular pixels having a longer edge of 18 $\mu$m and a shorter edge of 10 $\mu$m. The supporting layer thickness was in this instance 11.5 $\mu$m. There was no evidence of lateral spreading by the lens forming material, and nons of the lenses microscopically examined extended beyond a pixel boundary. The lenses exhibited a relatively short radius of curvature, with the foci of the lens appearing to lie within the supporting layer.

EXAMPLE 12

Example 3 was repeated, but with the substitution of a coating solution prepared by combining the following ingredients: 80 grams of chlorobenzene; 3.0 grams of keto-coumarin sensitizer; 3.0 grams of ethyl p-dimethylaminobenzoate activator; 40.0 grams of dipentaerythritol monohydroxyphenta-acrylate (commercially available under the trademark SR-399 from Sartomer Company, West Chester, Pa.); and 8.0 grams of a soluble methyl methacrylate polymer having an inherent viscosity of 0.50 and a molecular weight of approximately 150,000 (commercially available under the trademark Elvacite 2021 from Du Pont). The above composition was coated while spinning the wafer at 0.75 Krpm for 2 minutes. The wafer was then baked at 130° C. for 8 minutes in ambient air. Development was varied by continuously applying acetone while spinning the wafer at 0.2 Krpm for 30 seconds followed by spin drying at 3 Krpm for 60 seconds. The supporting layer thickness was 7.0 $\mu$m.

EXAMPLE 13

Example 3 was repeated, but with the substitution of a coating solution prepared by combining the following ingredients: 80 grams of chlorobenzene; 1.0 grams of keto-coumerin sensitizer; 1.0 grams of ethyl p-dimethylaminobenzoate activator; 17.0 grams of a dipentaerythritol monohydroxyphenta-acrylate (commercially available under the trademark SR-399 from Sartomer Company, West Chester, Pa.); and 35.0 grams of a soluble methyl methacrylate polymer having an inherent viscosity of 0.50 and a molecular weight of approximately 150,000 (commercially available under the trademark Elvacite 2021 from Du Pont). The above composition was coated while spinning the wafer at 3.0 Krpm for 2 minutes. The wafer was then baked at 130° C. for 8 minutes in ambient air. Development was varied by continuously applying 4-methyl-2-pentanone while spinning the wafer at 0.2 Krpm for 45 seconds followed by spin drying at 3 Krpm for 60 seconds. The supporting layer thickness was 15.8 μm.

The invention has been described in detail with particular reference to preferred embodiments thereof, but it will be understood that variations and modifications can be effected within the spirit and scope of the invention.

What is claimed is:

1. A light sensing semiconductor device including an array of light sensing pixels comprised of
   a semiconductive substrate, at least a portion of said substrate being of a first conductivity type, and laterally spaced regions of a second conductivity type forming within individual pixels a single light sensing portion spaced laterally inwardly from at least two opposed pixel edges and
   means for transmitting incident light to said light sensing portion including
   a lens presenting a convex surface capable of receiving light laterally outwardly of said light sensing portion and directing the light toward said light sensing portion, and
   a light transmissive portion interposed between said lens and said light sensing portion,
   characterized in that in at least one of said pixels
   said light transmissive portion is comprised of a lens supporting layer having a thickness exceeding that of said lens,
   said lens is laterally confined on said lens supporting layer and spaced laterally inward from at least said two opposed pixel edges, and
   said lens supporting layer and said lens are formed of different polymers, said supporting layer polymer exhibiting a higher glass transition temperature than said lens polymer and said lens polymer at its glass transition temperature being resistant to wetting the laterally surrounding surface of said lens supporting layer.

2. A light sensing semiconductor device according to claim 1 further characterized in that said lens of said one pixel is laterally confined on said lens supporting layer inwardly of each edge of said pixel.

3. A light sensing semiconductor device according to claim 2 further characterized in that said one pixel is polygonal, bounded by linear edges and said lens has edges parallel to said pixel edges and spaced inwardly therefrom.

4. A light sensing semiconductor device according to claim 1 further characterized in that said lens is a pillow lens.

5. A light sensing semiconductor device according to claim 1 further characterized in that said supporting layer has a lower optical density than said lenses at their greatest thickness.

6. A light sensing semiconductor device according to claim 1 further characterized in that said supporting layer surface areas surrounding said lenses are more hydrophobic than said lenses.

7. A light sensing semiconductor device according to claim 6 further characterized in that said material forming said lenses when coated as a planar layer exhibits a contact angle with an aqueous droplet containing 1.5 weight percent tetramethyl ammonium hydroxide which is at least 5° lower than said supporting layer forms with said droplet, the contact angle being measured 120 seconds after the water droplet and surface are brought into contact.

8. A light sensing semiconductor device according to claim 1 in which said lenses are formed of a positive working photoresist.

9. A light sensing semiconductor device according to claim 1 in which said supporting layer exhibits a thickness in excess of 6 μm.

10. A light sensing semiconductor device according to claim 9 further characterized in that said supporting layer is comprised of an acrylic or methacrylic polymer.

11. A light sensing semiconductor device comprised of an array of light sensing polygonal pixels, each adjacent of said polygonal pixels sharing a common linear edge and said polygonal pixels being comprised of
    a semiconductive substrate, at least a portion of said substrate being of a first conductivity type, and laterally spaced regions of a second conductivity type forming within individual pixels a single light sensing diode spaced laterally inwardly from said pixel edges and
    means for transmitting incident light to said light sensing diode including
    a lens having edges parallel to said pixel edges and presenting a convex surface capable of receiving light laterally outwardly of said light sensing diode and directing the light toward said light sensing diode, and
    a light transmissive lens supporting layer interposed between said lens and said light sensing diode,
    characterized in that
    said lens has edges parallel to and spacing inwardly from each of said pixel edges and is formed by a positive working photoresist,
    said light transmissive supporting layer has a higher degree of transparency than said lens at its greatest thickness and a thickness exceeding that of said lens, and
    said light transmissive supporting layer and said lens are formed of different polymers, said supporting layer polymer exhibiting a higher glass transition temperature than said lens polymer and said lens polymer at its glass transition temperature being resistant to wetting the laterally surrounding surface of the supporting layer.

12. A light sensing semiconductor device according to claim 11 wherein means cooperate with said semiconductive substrate to form a charge coupled device between a pair of said light sensing diodes, means are provided for electron transfer between said charge coupled device and a first light sensing diode of said pair, and means are provided to isolate said charge coupled device from a second light sensing diode of said pair.

13. A light sensing semiconductor device according to claim 12 additionally including a filter element interposed between a light sensing diode and said light transmissive supporting layer.

* * * * *